United States Patent
Moczygemba

(10) Patent No.: US 11,322,674 B2
(45) Date of Patent: May 3, 2022

(54) PORTABLE THERMAL POWER STATION

(71) Applicant: II-VI Delaware, Inc., Wilmington, DE (US)

(72) Inventor: Joshua Edward Moczygemba, Winona, TX (US)

(73) Assignee: II-VI DELAWARE, INC., Wilmington, DE (US)

( * ) Notice: Subject to any disclaimer, the term of this patent is extended or adjusted under 35 U.S.C. 154(b) by 241 days.

(21) Appl. No.: 16/672,150

(22) Filed: Nov. 1, 2019

(65) Prior Publication Data

US 2021/0135081 A1    May 6, 2021

(51) Int. Cl.
| | | |
|---|---|---|
| *H01L 35/32* | (2006.01) | |
| *H02J 7/00* | (2006.01) | |
| *F23M 20/00* | (2014.01) | |
| *H02J 7/34* | (2006.01) | |

(52) U.S. Cl.
CPC ............. *H01L 35/32* (2013.01); *F23M 20/00* (2015.01); *H02J 7/0042* (2013.01); *H02J 7/342* (2020.01); *F23M 2900/13003* (2013.01)

(58) Field of Classification Search
USPC ....................................................... 320/107
See application file for complete search history.

(56) References Cited

U.S. PATENT DOCUMENTS

| | | | |
|---|---|---|---|
| 6,392,312 B1 | 5/2002 | Morris | |
| 6,608,393 B2 | 8/2003 | Anderson | |
| 7,424,886 B1 | 9/2008 | Herzer | |
| 8,656,884 B1 | 2/2014 | Herzer | |
| 9,121,372 B2 | 9/2015 | Herzer | |
| 9,175,601 B2 | 11/2015 | Markoski | |
| 9,765,918 B2 | 9/2017 | Herzer | |
| 2005/0120715 A1* | 6/2005 | Labrador | F02C 1/05 60/618 |
| 2007/0210063 A1* | 9/2007 | Conrad | C25B 1/04 219/449.1 |
| 2008/0241614 A1* | 10/2008 | McCanney | B60L 58/40 429/411 |
| 2012/0282561 A1* | 11/2012 | Kaiser | F24H 1/0027 432/1 |
| 2013/0340802 A1* | 12/2013 | Jovovic | H01L 35/30 136/201 |
| 2014/0020730 A1* | 1/2014 | Imran | H01L 35/00 136/205 |
| 2021/0135081 A1* | 5/2021 | Moczygemba | H02J 7/0042 |

* cited by examiner

*Primary Examiner* — Mohammed Alam
(74) *Attorney, Agent, or Firm* — Blank Rome LLP

(57) ABSTRACT

This disclosure provides an apparatus for a portable thermal power station and related methods. The power station includes a burner, a reservoir, an output power plug, and a thermoelectric generator. The burner produces combustible heat across a surface. The reservoir stores a cooling fluid. The output power plug electrically connects to an external device. The thermoelectric generator receives heat energy, converts the heat energy to electrical energy, outputs the converted electrical energy to the external device, and disperses excess heat energy to the reservoir.

22 Claims, 5 Drawing Sheets

PORTABLE THERMAL POWER STATION

TECHNICAL FIELD

The present application relates generally to power stations and, more specifically, to a portable thermal power station.

BACKGROUND

Current portable power stations have limitations that reduce the ability to provide power. Current power stations use a battery, internal combustion generators, and solar generators. Batteries have limited run time based on capacity. Internal combustion generators are noisy. Solar generators are dependent on weather and daytime.

SUMMARY

This disclosure provides a portable thermal power station.

In a first embodiment, a power station is provided. The power station includes a burner, a reservoir, an evaporator, an output power plug, and a thermoelectric generator. The burner produces combustible heat across a surface. The reservoir stores a cooling fluid. The output power plug electrically connects to an external device. The thermoelectric generator receives heat energy, converts the heat energy to electrical energy, outputs the converted electrical energy to the external device, and disperses excess heat energy to the reservoir. Finally, the heat is then expelled from the reservoir to ambient through the evaporator.

In a second embodiment, a method for operating a power station is provided. The method includes producing combustible heat across a surface of a burner of the power station; storing a cooling fluid in a reservoir of the power station; electrically connecting an external device to an output power plug of the power station; receiving heat energy from the combustible heat of the burner at a supply side of a thermoelectric generator of the power station; converting the heat energy into electrical energy using the thermoelectric generator; outputting the converted electrical energy to power the external device through the output power plug using the power output of the thermoelectric generator; and dispersing excess heat energy from the waste side of the thermoelectric generator to ambient via the cooling fluid and evaporator.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 5, discussed below, and the various embodiments used to describe the principles of the present disclosure in this patent document are by way of illustration only and should not be construed in any way to limit the scope of the disclosure.

Adding thermoelectric generation capability to a portable power station provides an electrical power source for the other elements without access to a stable power supply, such as transmission from a power plant. This approach eliminates the need for carrying excessive batteries or other loud power stations that may generate power from a combustion engine.

Figure 1:
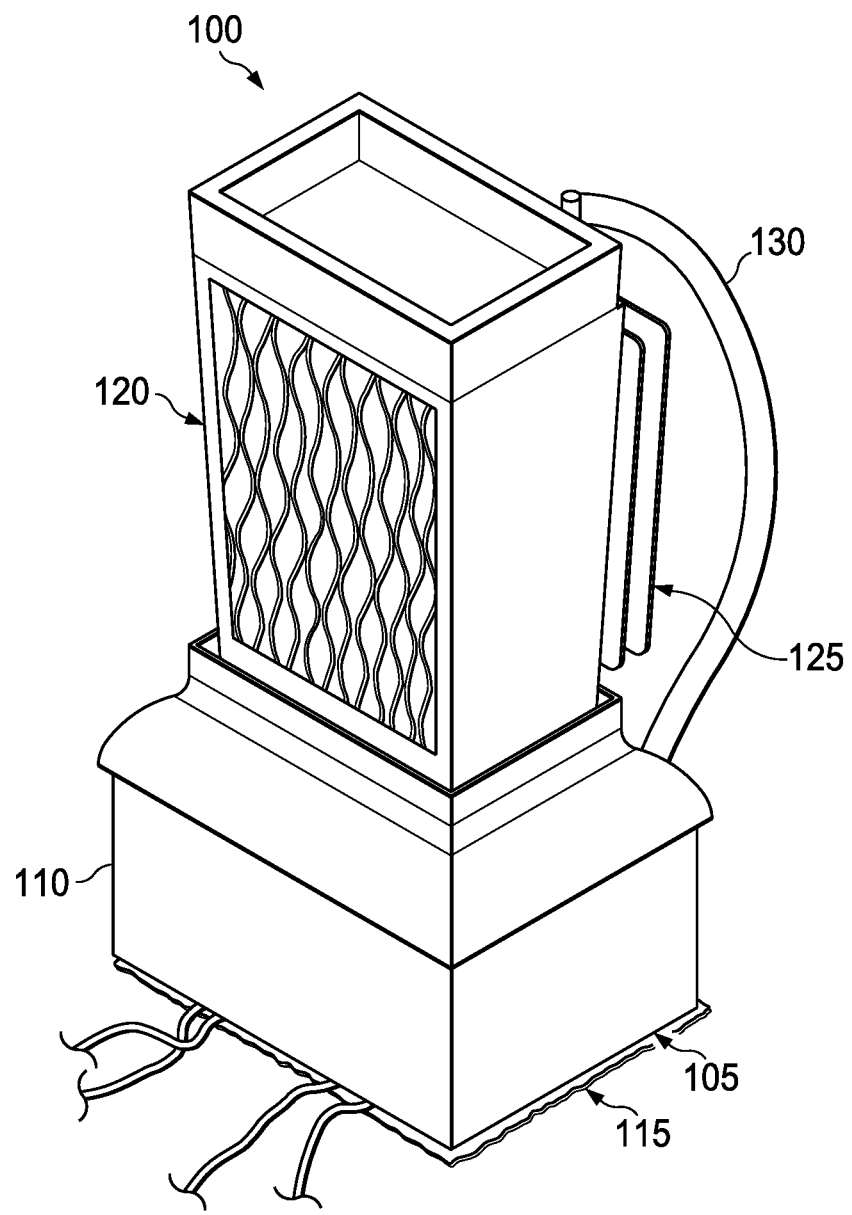
FIG. 1 illustrates an exemplary exterior view of a non-electric powered, off-grid, portable thermal power station in accordance with various embodiments of the present disclosure.

FIG. 1 illustrates an exemplary exterior view of a non-grid powered, power station 100 in accordance with various embodiments of the present disclosure. The embodiment of the non-electric powered, off-grid, power station 100 illustrated in FIG. 1 is for illustration only. FIG. 1 does not limit the scope of this disclosure to any particular implementation of a portable thermal power station.

The power station 100 is portable and can use a thermoelectric generator (TEG) 105 to convert the heat from a heat source into an electric current to power any electrical components in the power station 100. The power station 100 does not require an exterior power source for operating the components of the power station 100. The power station 100 can include a TEG 105, a cooling fluid reservoir 110, a base 115 a cold sink evaporator 120, a fan 125, and a pump 130.

The TEG 105 can be positioned between the base 115 and the cooling fluid reservoir 110. The supply side of the TEG 105 can be positioned adjacent to the base 115. The waste side of the TEG 105 can be positioned adjacent to the cooling fluid reservoir 110 for dispersing heat into the cooling fluid reservoir 110. The TEG 105 receives heat from the base 115 and converts a portion of the heat into electrical energy to be consumed by the electrical components or stored in electrical power storage element (battery, super capacitor, etc.) of the power station 100. Heat not converted to energy is dispersed on the waste side of the TEG 105 into the cooling fluid reservoir 110. A single TEG 105 can be implemented in the power station or an array of TEGs 105 can be arranged for enhanced energy conversion.

The cooling fluid reservoir 110 is positioned on the waste side of the TEG 105. The cooling fluid reservoir 110 stores a volume of cooling fluid that is used for dispersing heat from the TEG 105 that is not converted into electrical power. Heat fins or some other protrusion can extend from the base of the cooling fluid reservoir 110 through the depth in order to more evenly disperse the heat through the cooling fluid reservoir 110.

The base 115 is positioned on the supply side of the TEG 105. The base 115 can be made of a material that is thermally conductive to transfer heat from a heat source, such as an open flame, while protecting the TEG 105 from damage.

The cold sink evaporator 120 is an open loop evaporative cooling cold sink. The cooling fluid from the reservoir is distributed across a top of the cold sink evaporator 120 using the pump 130. The cooling fluid proceeds to travel down the cold sink evaporator 120 back to the reservoir 110. The fan 125 forces air across the cold sink evaporator 120 providing a cooling effect on the cooling fluid as heat is removed to the exterior of the power station 100. The circulation of the cooling fluid through the cold sink evaporator keeps the temperatures of the cooling fluid reservoir 110 regulated in a manner that the reservoir 110 does not overheat. The cold sink evaporator 120 can include a fill material structured as a honeycomb or tessellation. The fill material can be made of a non-absorbent material, such as wood or cardboard. The fill material aids in heat dissipation by spreading the cooling fluid across an increased heat transfer surface area that air can flow across.

The fan 125 can be attached to one side of the cold sink evaporator 120. The fan forces air through the open areas of the fill material providing a cooling effect on the cold sink evaporator 120. The fan is powered directly or indirectly by the TEG 105 and controlled by a controller of the power station 100.

The pump 130 moves cooling fluid from the cooling fluid reservoir 110 to the top of the cold sink evaporator 120. The pump 130 is powered directly or indirectly by the TEG 105 and controlled by a controller of the power station 100.

Figure 2:
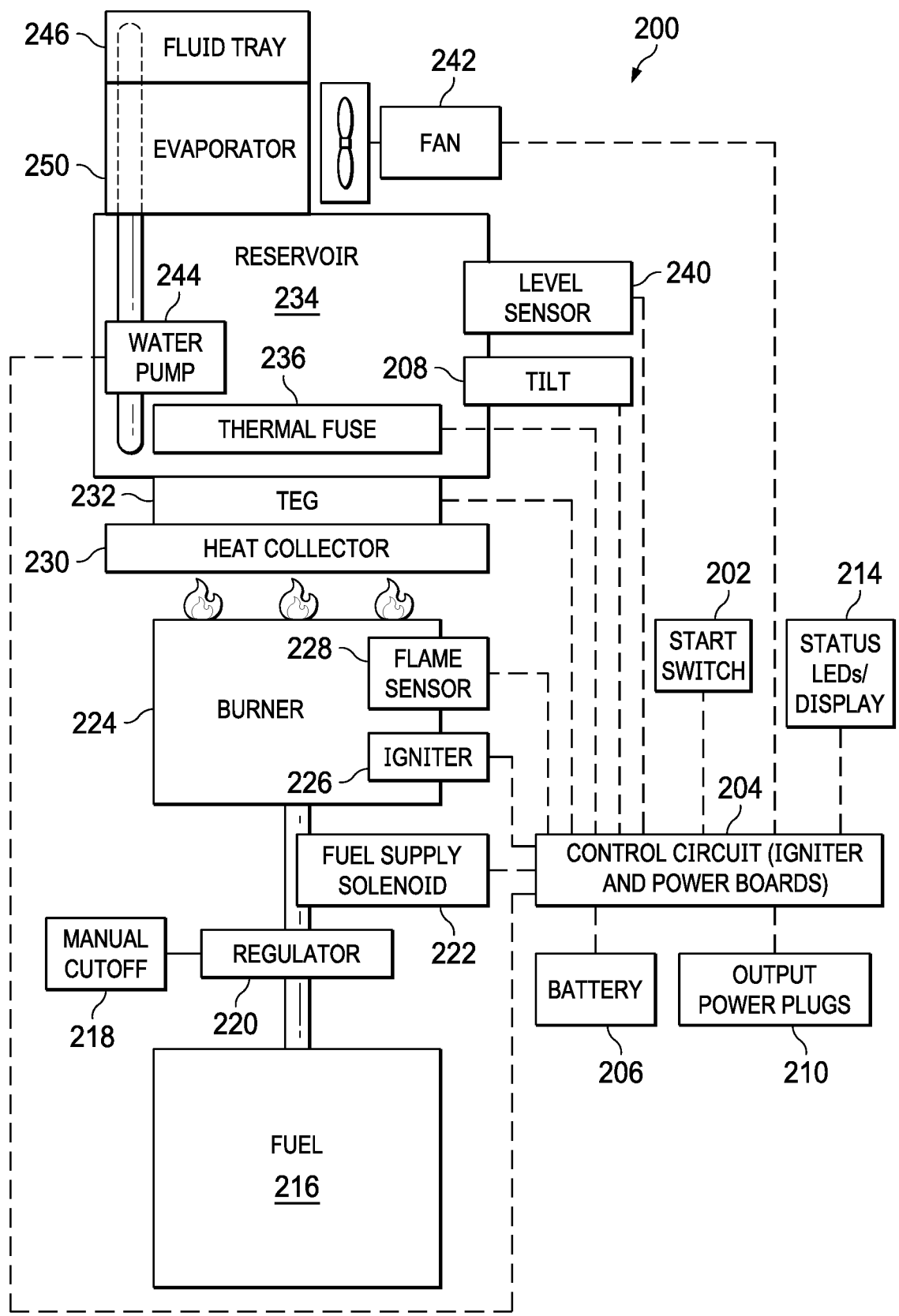
FIG. 2 illustrates an exemplary interior view of a non-electric powered, off-grid, portable thermal power station in accordance with various embodiments of the present disclosure.

FIG. 2 illustrates an exemplary interior view 200 for a non-electric powered, off-grid, portable thermal power station in accordance with various embodiments of the present disclosure. The embodiment of the interior view 200 illustrated in FIG. 2 is for illustration only. FIG. 2 does not limit the scope of this disclosure to any particular implementation of a portable thermal power station.

The parts of the power station 100 include the components for generating the electrical power and regulating the control of the power station 100. These parts can include a start switch 202, a control circuit 204, a battery 206, a tilt sensor 208, an output power plug 210, one or more status LEDs 214, a fuel container 216, a manual cutoff 218, a regulator 220, a fuel supply solenoid 222, a burner 224, an ignition 226, a flame sensor 228, a heat collector 230, a thermoelectric generator 232, a reservoir 234, a thermal fuse 236, a fluid level sensor 240, a fan 242, a cooling fluid pump 244, a cooling fluid tray 246 and an evaporator 250.

The start switch 202 can be located on the exterior of the power station 100. The start switch 202 can be depressed to begin the power generation. The start switch 202 can be connected to the control circuit 204. The start switch 202 can cause the control circuit 204 to begin operating using stored power in the battery 206.

The control circuit 204 receives the sensor reading from the different tilt sensor 208, flame sensor 228, level sensor 240, etc. The control circuit 204 receives power from the battery 206 charged by the TEG 232 and the TEG 232 itself. The control circuits 204 can control the different parts of the process of the power station 100 including controlling the burner 224, the ignition 226, the gas solenoid 222, and the cooling fluid pump 244.

The battery 206 is primarily charged by the TEG 232. The battery 206 can be a rechargeable battery that is used to power the electrical components of the power station 100. The battery 206 can store enough power to operate certain sensors and electrical components (spark igniter, pump, solenoid) related to the power station 100. For instance, when the start switch 202 is activated, the battery 206 can provide power to open the gas solenoid and trigger the spark igniter to light the burner for heating the TEG 232 to generate electrical power. The battery 206 can also charge an external device connected to the output power plugs 210.

The tilt sensor 208 can be located at the base of the power station 100. The tilt sensor 208 is connected to the control circuit 204. When the power station 100 is tilted past a specific degree, the tilt sensor 208 can cause the control circuits 204 to shut off the burner 224. If the burner 224 is burning at an angle or upside, the power station 100 could start an unplanned fire or potential explosion. The control circuits 204 can be one or both of the operations circuit 334 and the power control circuit 336.

The output power plug 210 can be mounted on a side of the power station 100 and connected to the control circuit 204, battery 206, and the TEG 232. The output power plug 210 can be used to connect an external device and transfer power from the battery 206 and the TEG 232 to the external device.

The status indicators 214 can be located on an external part of the base of the power station 100 and can indicate different statuses of the power station 100. For example, the status indicators 214 can include a temperature indicator, a charging indicator, a reservoir level indicator, etc. The status indicators 214 can be LEDs or other type of optical indicators. The status indicators 214 can be connected directly to the control circuit 204 or to different sensors, such as a tilt sensor 208, to indicate the measurement of the respective sensor.

The fuel container 216 can contain fuel meant for the burner 224. The fuel container 216 can be removable or replaceable. The fuel container 216 is located in the power station 100 housing or can be exterior to the power station 100. The base of the power station 100 can include a hollow area for receiving the fuel container 216 that attaches to a base of the burner 224.

The manual cutoff 218 can be used to manually shut off the flow of fuel from the fuel container 216 to the burner 224 for long term storage. The manual cutoff 218 can be located before the fuel supply regulator 220 on the fuel supply path. The manual cutoff 218 can be used in situations where the fuel supply solenoid 222 and or the fuel supply regulator 220 are not functioning properly. The manual cutoff 218 can be used to close the fuel supply path, when not in use, to ensure that the power station 100 does not accidently operate unintendedly.

The gas regulator 220 can control the pressure of the gas input to the burner from the fuel container 216. The gas in the fuel container is usually at a much higher pressure than the burner can accommodate directly. The gas regulator 220 controls the exit pressure of the gas that leaves the fuel container 216 to ensure compatibility with the burner. The gas regulator 220 is installed in the gas line of the power station 100.

The gas solenoid 222 can control the flow of gas from the fuel container 216. While the gas regulator 220 reduces the pressure of the gas, the gas solenoid 222 opens or closes the fuel path to the burner. The control circuits 204 can control the gas solenoid based on the operation of the power station 100 and the different sensors of the power station 100.

The burner 224 can evenly disperse the combustion heat from the gas from the fuel container 216 across an exterior surface with the proper mixture of air. The burner 224 is in the fuel supply after the gas solenoid 222 and the gas regulator 220. The burner 224 distributes the exiting gases in manner to not allow the flames to reverse back to the fuel container. The flames from the burner 224 are distributed across the heat collector 230.

The ignition 226 can provide an ignition source for the burner 224. The ignition 226 can provide an electrical spark that causes the gases being released from the burner 224 to ignite. The battery 206 can provide the power to the ignition 226 for creating the electrical spark. The ignition 226 is located at the burner 224.

The flame sensor 228 can detect a flame coming from the burner 224. The flame sensor can be located between the burner 224 and the heat collector 230. The flame sensor 228 can also be located in proximity to the ignition 226. When a flame is detected from the ignition 226 or the burner 224, the flame sensor 228 can provide the information to the control circuits 204 or a corresponding ignition control circuit.

The heat collector 230 is connected to a supply side of the TEG 232. The heat collector 230 absorbs the heat generated from the ignited gases being distributed across the burner 224. The heat collector 230 can include a plurality of fins for absorbing heat. The heat collector 230 is made of a thermally conductive material for absorbing and transferring heat from the ignited gas of the burner to the TEG 232.

The TEG 232 can receive heat from the heat collector 230 on the supply side of the TEG 232 and output heat on the waste side of the TEG 232 and output electricity to the battery 206, the control circuits 204, the tilt sensor 208, the cooling fluid pump 244, the gas solenoid 222, the flame sensor 228, the fan 242, or any other electrical component of the power station 100. While the TEG 232 powering the entire power station 100 is ideal for being portable, a separate charger could be included in different embodiments. The heat output on the waste side of the TEG 232 can be dispersed to the fluid in the reservoir 234.

The reservoir 234 can receive and store cooling fluid or other cooling liquid for the heat dissipation process from the TEG 232. The reservoir 234 is located at the top of the power station 100, above the TEG 232. The fluid is heated in the reservoir 234 before exiting or being pumped through the evaporator 250.

The thermal fuse 236 can be located outside, inside or as part of the reservoir 234. Thermal fuse 236 can be set to different temperature thresholds. When the thermal fuse 236 reaches the respective temperature threshold, the electrical current is interrupted and the power station 100 is shut off.

The fluid level sensor 240 can be located in the reservoir 234. The fluid level sensor 240 can be connected to the control circuit 204 to provide fluid levels of the reservoir 234. The control circuit 204 can perform operations of the power generation process based on the fluid level of the reservoir 234 detected by the fluid level sensor 240. The fluid level sensor 240 could function to be able to detect the level of the fluid in the reservoir 234 or detect a specific fill level of the reservoir. For example, a specific fill level of the reservoir 234 could be a minimal amount for heat dispersion from the waste side of the TEG 232.

The fan 242 is attached to one side of the cold sink evaporator 120. The fan forces air through the open areas of the honeycomb or tessellation shape structure providing a cooling effect on the cold sink evaporator 250. The fan is powered directly or indirectly by the TEG 232 and controlled by a control circuit 204 of the power station 100.

The cooling fluid pump 244 can be located in the base or the top of the power station 100. The cooling fluid pump 244 pumps the cooling fluid from the reservoir 234 to flow to the cooling fluid tray 246. The control circuit 204 can control the operation of the cooling fluid pump 244. For example, the control circuit 204 can detect through the level sensor 240 that the cooling fluid in the reservoir 234 is at a level for adequate heat dispersion from the waste side of the TEG 232.

The cooling fluid tray 246 can be located above the evaporator 250. The cooling fluid tray 246 receives the cooling liquid from the reservoir 234 through the action of the pump 244. The cooling fluid tray 246 can evenly distribute the cooling liquid across the area of the evaporator 250. Extra fluid can be added to the cooling fluid tray 246 or some other reservoir opening to replace fluid loss from the evaporation occurring in the evaporator 250.

The evaporator 250 can be located above the reservoir 234. The evaporator 250 is an open loop evaporative cooling cold sink. The fluid from the reservoir 234 is distributed across a top of the evaporator 250 using the pump 130 and the cooling fluid tray 246. The fluid proceeds to travel down the evaporator 250 back to the reservoir 234. The fan 242 forces air across the evaporator 250 providing a cooling effect on the cooling fluid as heated water vapor is expelled to the exterior of the power station 100. The circulation of the cooling fluid through the evaporator 250 can keep the temperatures of the fluid in the reservoir 234 regulated in a manner that the reservoir 234 does not overheat. The interior of the evaporator 250 can be structured as a honeycomb or tessellation.

The power station may also have an extended surface area in the path of the evaporator exhaust air stream that is used to condense water from the air. The water that is collected can then be routed back to the cooling liquid reservoir for reuse. Such a configuration would reduce the frequency of adding cooling fluid to the reservoir. Likewise, the same or similar condensing surface can be used to capture water vapor from the exhaust gas stream of the burner.

FIG. 3 illustrates an exemplary digital circuit block diagram 300 for a non-electric powered, off-grid, portable thermal power station in accordance with various embodiments of the present disclosure. The embodiment of the digital circuit block diagram 300 illustrated in FIG. 3 is for illustration only. FIG. 3 does not limit the scope of this disclosure to any particular implementation of a power station.

The digital circuit diagram 300 includes components in the power station 100. The components can include an igniter board 302 and a power board 304. The igniter board 302 can accommodate a flame sensor 306, an igniter 308, thermostat 310, a solenoid control 312, a sensor switch 314, a battery control 316, and a grounding wire 318. The igniter board 302 can connect to the temperature sensor 320, a gas shutoff solenoid 322, a tilt switch 324, a cooling fluid level switch 326, a thermal fuse 328, a rechargeable battery, and a start switch 332. The power board 304 can include an operations circuit 334, a maximum power point tracking (MPPT) charge controller 336, and a DC to AC inverter circuit 358 connected to one or more output power plugs 360. The operations circuit 334 can include a burner control 338, a status LEDs control 340, and a cooling fluid or water pump control 342. The MPPT circuit 336 can include a TEG input 344 and a battery charger circuit 346. The power board 304 can be connected to the rechargeable battery 330, the start switch 332, a heating LED 348, the cooling fluid pump 354, the fan 352, and the TEG 356.

The igniter board 302 receives a signal from the start switch 332 to begin the power generation process. The igniter board 302 checks the sensors before dispensing gas to make sure the power station 100 is in an operable setting. The igniter board 302 activates the gas solenoid 322 to start fuel flow and ignites the burner. The start switch signals the operations circuit 334 to commence the processes associated with generating electrical power. The igniter 308 is controlled by the operations circuit 334. The igniter 308 is used to ignite the fuel being dispensed from the burner. The igniter 308 can be a constant flame or a repetitive electric pulse used to ignite the fuel. The igniter board 302 can detect when the fuel is being dispensed from the fuel container and activate the igniter 308 accordingly. The igniter 308 can also be used when the flame sensor 306 detects that the flame went out for any reason to reignite the fuel dispensed out of the burner.

The thermostat 310 is part of the igniter board 302 and is connected to the temperature sensor input of the operations circuit 334. The operations circuit 334 can receive a signal from the thermostat 310 and determines a temperature detected by the thermostat 310. The thermostat 310 can signal when the temperature of the reservoir is at a temperature in excess of optimally converting power by the TEG 232 or safe operation. The thermostat 310 can monitor the temperature in the reservoir 234. The thermostat 310 can be activated upon detecting a temperature of the cooling fluid in the reservoir 234. The thermostat 310 can relay a signal to the shut off the operations circuit 334.

The solenoid control 312 is connected to the gas shutoff solenoid 322. The solenoid control 312 can operate the shutoff solenoid 322 to control the flow of the gas from the gas container to the burner. The solenoid control 312 can signal the igniter board 302 that the gas shutoff solenoid is activated. The solenoid control 312 can control the flow of fuel from the fuel container to the burner. The igniter board 302 can open the gas solenoid 322 to release the flow of fuel to the burner. If the igniter board 302 detects a problem with the power station 100, the operations circuit 334 can close the gas solenoid to halt flow of the fuel to the burner. The gas solenoid is also of the normally closed type for safety. Should any interruption in the circuit occur (such as lost power), it automatically closes.

The sensor switch 314 can be connected to the normally-closed tilt switch 324, the cooling fluid level switch 326 and the thermal fuse 328. The cooling fluid level switch 326 can be located at the reservoir 234. The cooling fluid level switch 326 can detect if the cooling fluid in the reservoir is above a minimal threshold. When the cooling fluid drops below the threshold, the cooling fluid level switch 326 can signal the igniter board 302 and the power board 304 to shut off. The power board 304 can use the signal from the cooling fluid level switch 326 to control a status LED to indicate to the user of the power station 100 that the reservoir is low on cooling fluid. The sensor switch can detect when the thermal fuse 328 is activated when a temperature of the reservoir exceeds a functioning temperature or a temperature that is too high for the heat dispersion from the TEG 356 during the power generation process.

The battery control 316 can control the power distribution to the operations circuit 334 from the rechargeable battery 330 and the TEG 356. The battery control 316 can cutoff the power from the battery 330 upon detecting that the power station 100 is not in an operable state.

The rechargeable battery 330 is charged from the TEGs 356. The rechargeable battery 330 can be initially charged. The rechargeable battery 330 can provide power for all the electrical components of the power station 100. The start switch 332 is a switch to indicate the beginning of the power generation process which begins with the heating of the base under the TEG 356.

The power board 304 can control the cooling fluid portion of the power generation process. The power board 304 can indicate to the user the power received from the TEGs 356. The power board 304 can also condition the raw power produced by the TEG 356 through an MPPT circuit 336. The power board 304 can also serve as a charge control circuit for safely charging the rechargeable battery 330 or an external device through the output power plugs 360.

The burner control 338 is connected to the start switch 332. The burner control 338 receives indication to begin the power generation process by initiating the igniter, solenoid, etc. The burner control 338 can communicate with the other circuitry during the power generation process.

The status controls 340 can indicate the status of the power generation process during operation of the power station 100. The status controls 340 can be powered by the rechargeable battery or by the TEGs 356. The status control 340 can operate a heating LED while the operation circuit 334 is operating, a power generation LED while the power board 304 is operating, and an external charging LED 348 when an external electrical device is connected and receiving power through the output power plugs 360.

The pump 354 is controlled by the pump control 342. The pump 354 can pump cooling fluid from the reservoir 234 to the cooling fluid tray 246. The pump 354 can be activated upon the temperature switch indicating that the cooling fluid is sufficiently heated for the power generation process. The pump 354 can be powered by the rechargeable battery 330 and can have a status LED for indicating the pumping operation to the user.

The TEG control 344 can receive the power from the TEG 356 and distribute the power accordingly. The battery control 346 can monitor the status of the battery and the power out of the MPPT charge circuit 336. The TEG 356 exclusively powers the entire power station 100. The power stored in the rechargeable battery can be provided from the TEG 356 for the next use of the power station 100. The heat from the burner 350 is spread across the supply side of the TEG 356 and a portion is converted to power the power station 100 and the remaining portion is dispersed using the cooling fluid in the reservoir.

The inverter circuit 358 can convert the power generated to an appropriate power type (DC, AC etc.) for the external device connected to the output power plugs 360. The inverter 358 can determine whether an external device is connected to the output power plugs 360 to control the distribution of the power generation between the external device and the rechargeable battery 330.

Figure 3A:
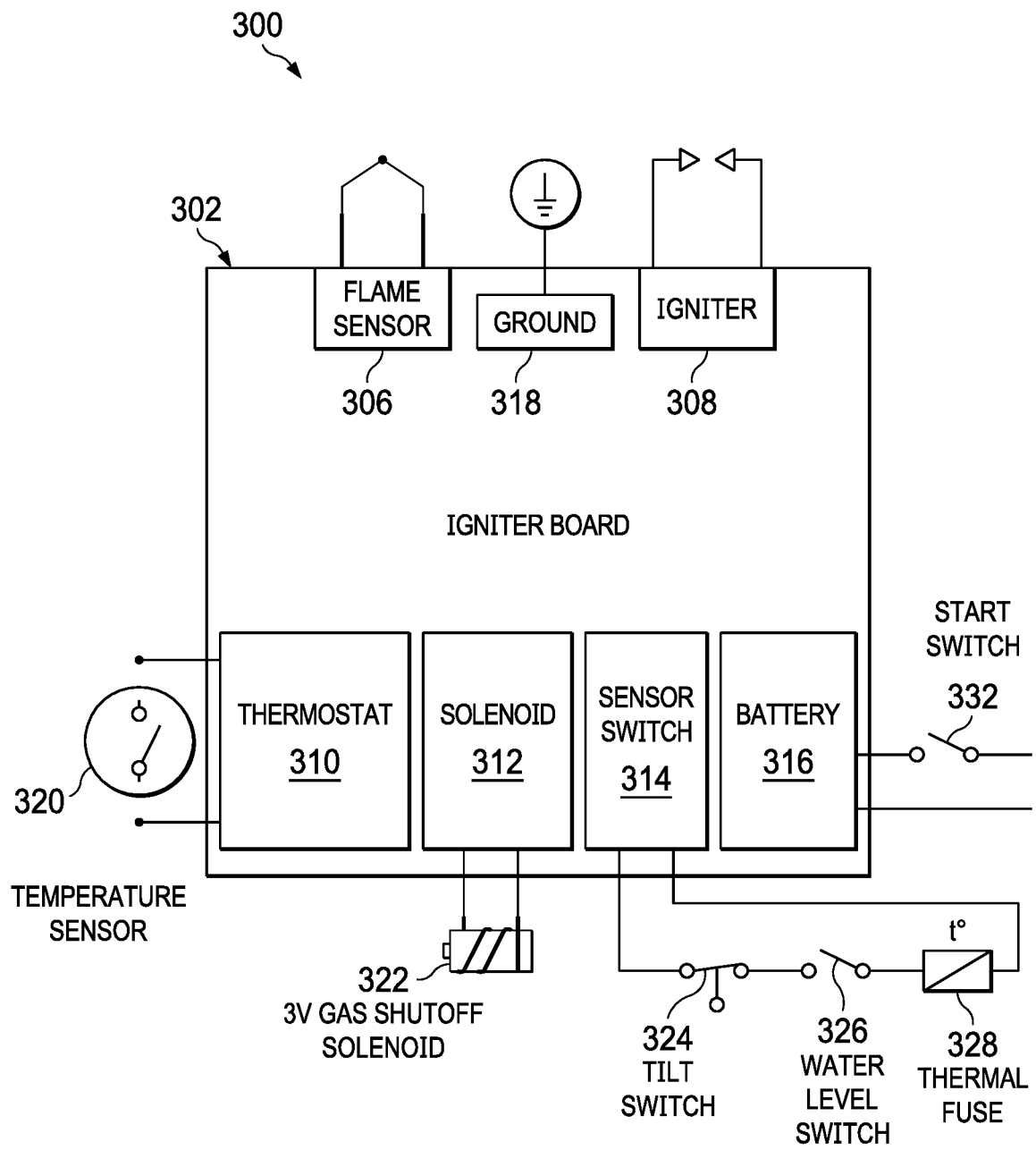
FIGS. 3A and 3B illustrates exemplary digital circuit block diagram for a non-electric powered, off-grid, portable thermal power station in accordance with various embodiments of the present disclosure.
Figure 3B:
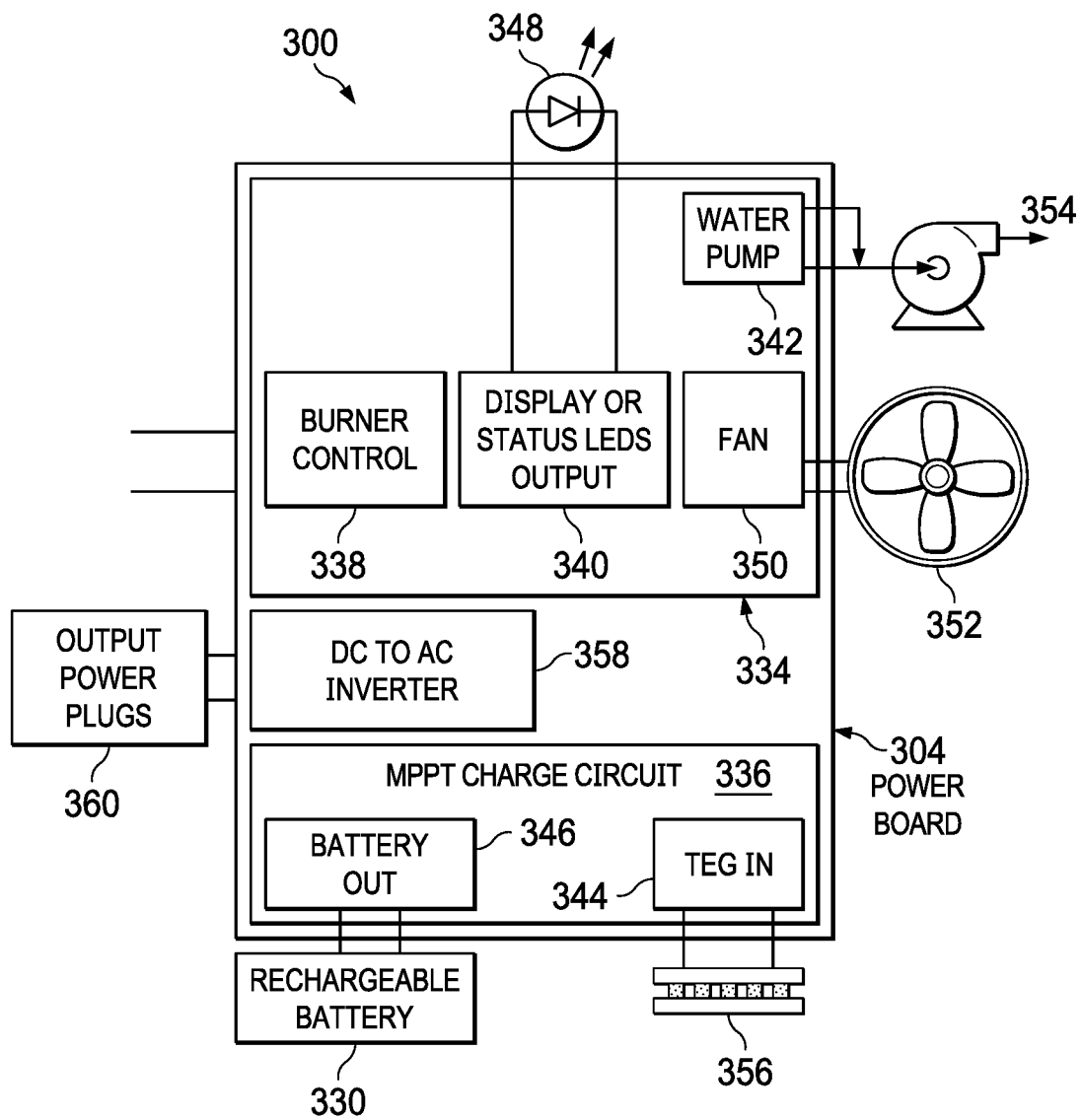
Figure 4:
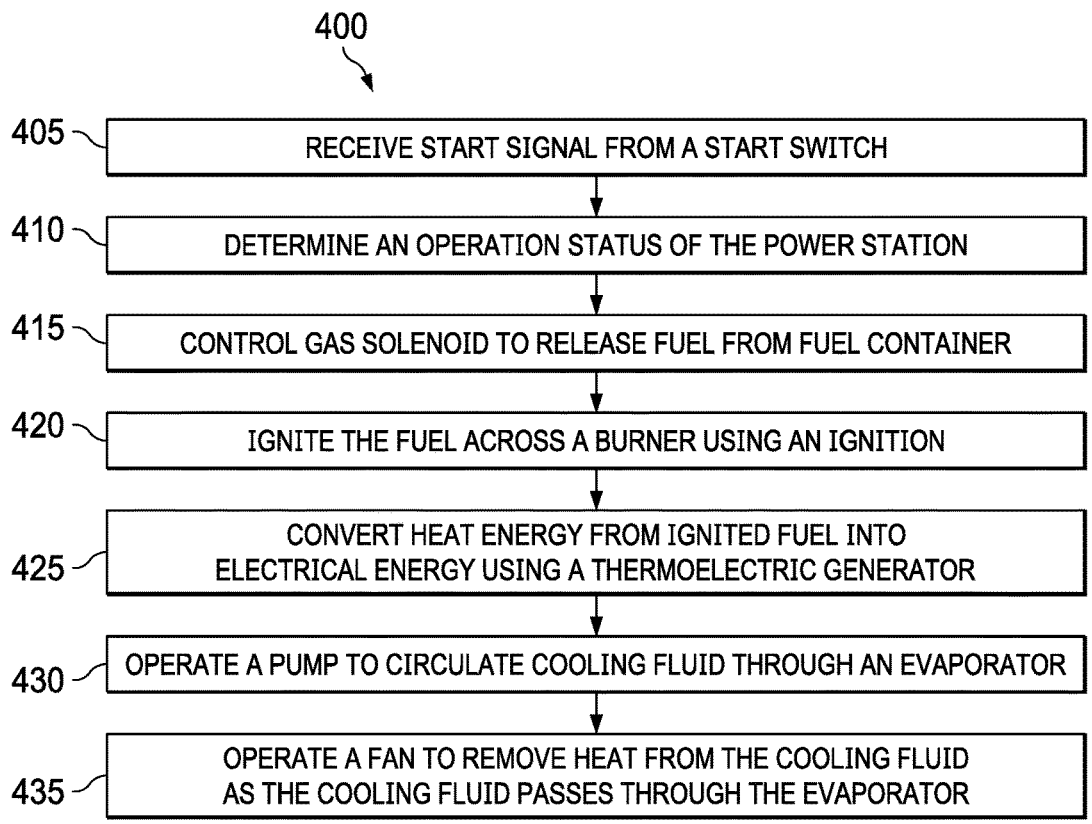
FIG. 4 illustrates a process for a non-electric powered, off-grid, portable thermal power station in accordance with various embodiments of the present disclosure.

FIG. 4 illustrates a process 400 for a non-electric powered, off-grid, power station in accordance with various embodiments of the present disclosure. For example, the process depicted in FIG. 4 may be performed by the control circuit 204 illustrated in FIG. 2, the igniter board 302 and the power board 304 illustrated in FIGS. 3A and 3B, and the electronic power station 500 in FIG. 5.

In operation 405, the power station 500 can receive a start signal from the start switch 332. The start signal can initiate a power generation process in the power station 100. The start switch 332 can be a mechanical switch or a user interface. The start signal is sent to the igniter board 302 and the power board 304.

In operation 410, the power station 500 can receive signals from the tilt sensor 208, the fluid level sensor 240, flame sensor 228, and thermal fuse 236 to determine the operation status of the power station 100. The power station 500 can receive an orientation measurement from the tilt sensor 208, a flame measurement from the flame sensor 228, a fluid level from the fluid level sensor 240, etc. The respective measurements can be processed to ensure the operational requirements for the power station 100. An example of an operational requirement can include that the power station 100 is at a substantially vertical orientation.

In operation 415, the power station 500 can control the gas solenoid 345 to release fuel from the fuel container to the burner 350. The fuel stored in the fuel container is highly pressurized in order to use the burner for an extended period of time. The pressure of the fuel in the fuel container is too high to use safely without reducing the pressure. The fuel regulator is used to reduce the storage pressure to an operational pressure. The gas solenoid is used to open or close the fuel path from the fuel container to the burner. The fuel is dispersed across the burner for even heat to be applied to a hot sink or the supply side of the thermoelectric generator.

In operation 420, the power station 500 can control the igniter 308 to ignite the fuel across the surface of the burner 350. The power station 500 can start the igniter 308 when the gas solenoid is opened and fuel is flowing to the burner. The igniter 308 can also be used when the flame is no longer detected by the flame sensor 306, but the solenoid 322 has not yet been closed.

The power station 500 can store the electrical energy generated by the thermoelectric generator in a battery. When a charging status of the battery is detected as full, the power station 500 can shut off the burner. When an external device is connected to an output power plug, the power station can charge the external device using the electrical energy stored in the battery. When the charging status of the battery falls below a charging threshold, the power station 500 can activate the burner. The charging threshold can be determined based on the battery voltage. For example, when the battery voltage falls below a predetermined value, the power station activates the burner. The thermoelectric generator begins producing electrical energy that can be used to power the external device and charge the battery.

When the thermoelectric generator is operating the power station can determine the optimal routing of the electrical energy based on the based on the power output of the thermoelectric generator and the load factor of charging the external device. For example, when the load of the external device is greater than electrical energy being generated by the thermoelectric device, the power station 500 can increase the amount of fuel being released to the burner by the solenoid. The amount of fuel output to the burner can be regulated to maximize efficiency between charging the battery and the external device without having to excessively repeat turning the burner on and off.

In operation 425, the power station uses the TEG to convert a portion of the heat energy from the ignited fuel into electrical energy. The flame provides heat to hot sink or directly to the supply side of the thermoelectric generator 356. The thermoelectric generator 356 can convert a portion of the heat into electricity to be output for the use of powering the components of the power station 500 and charging an external device. This power supply from the conversion of the combusted heat on the supply side of the thermoelectric generators is enough to solely power the entire power station 500. The remaining heat is transferred to the waste side of the thermoelectric generator, which is connected to the reservoir 234 for dispersing the heat throughout the cooling fluids. The inverter 348 can convert the DC power generated by the thermoelectric generator into AC power to be output through the output power plugs 360. The components of the power station operate at a cumulative sound level below 50 dBA when the thermoelectric generator is operating at max capacity.

In operation 430, the power station 500 can operate the pump 365 to circulate the cooling fluid through the evaporator 250. The cooling fluid passes through the evaporator 250 from the reservoir 234 to the cooling fluid tray 246. The cooling fluid tray 246 can distribute the cooling fluid across a top of the evaporator 250. The cooling fluid drips down a fill material used to remove heat from the cooling fluid. The power supply generated from the conversion of heat to power by the TEG 356 can be used to power the pump 365.

In operation 430, the power station 500 to remove heat from the cooling fluid as the cooling fluid passes through the evaporator. The power station 500 can operate the fan 242 to produce an air current to pass through the evaporator 250. The air current increases the heat removal from the cooling fluid as the cool fluid passes from the cooling fluid tray 246 to the reservoir 234 by expelling heated water vapor into the ambient air. The power supply generated from the conversion of heat to power by the TEG 356 can also be used to power the fan 242.

Although FIG. 4 illustrates an example a process for operating a non-electric powered, off-grid, portable thermal power station, respectively, various changes could be made to FIG. 4. For example, while shown as a series of steps, various steps in each figure could overlap, occur in parallel, occur in a different order, or occur multiple times.

Figure 5:
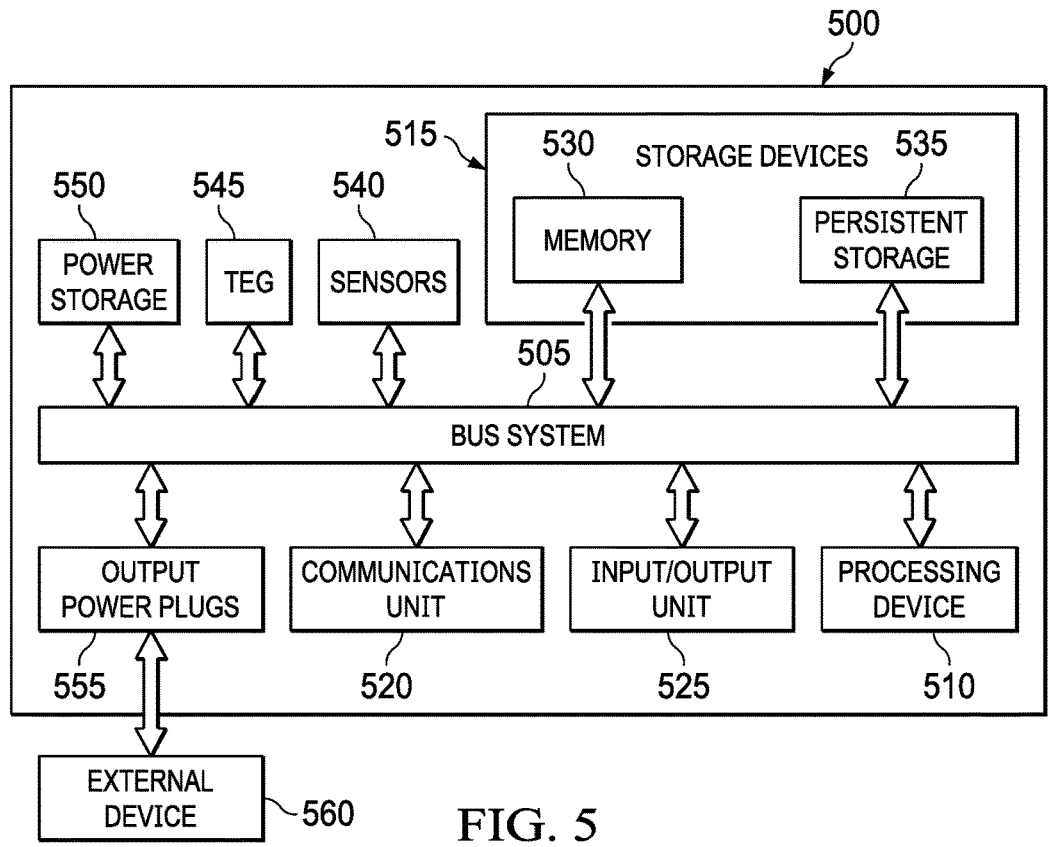
FIG. 5 illustrates an example device implemented with a non-electric powered, off-grid, portable thermal power station according to this disclosure.

FIG. 5 illustrates an example power station 500 according to this disclosure. The embodiment shown in FIG. 5 is for illustration only. Other embodiments could be used without departing from the scope of the present disclosure.

As shown in FIG. 5, the power station 500 includes a bus system 505, which supports communication between at least one processing device 510, at least one storage device 515, at least one communications unit 520, at least one input/output (I/O) unit 525, at least one sensor 540, a TEG 545, a power storage 550, and output power plugs 555.

The processing device 510 can be the control circuit 204 illustrated in FIG. 2, the igniter board 302 illustrated in FIG. 3A, and the power board 304 illustrated in FIG. 3B. The processing device 510 executes instructions that may be loaded into a memory 530. The processing device 510 may include any suitable number(s) and type(s) of processors or other devices in any suitable arrangement. Example types of processing devices 510 include microprocessors, microcontrollers, digital signal processors, field programmable gate arrays, application specific integrated circuits, and discreet circuitry. The processing device 510 can be programmable or can download operating parameters for operating the components of the power station 100.

The memory 530 and a persistent storage 535 are examples of storage devices 515, which represent any structure(s) capable of storing and facilitating retrieval of information (such as data, program code, and/or other suitable information on a temporary or permanent basis). The memory 530 may represent a random access memory or any other suitable volatile or non-volatile storage device(s). The persistent storage 535 may contain one or more components or devices supporting longer-term storage of data, such as a ready only memory, hard drive, flash memory, or optical disc. The persistent storage 535 includes the instructions for determining the operating status of the power station 100 and operations for outputting electric power.

The communications unit 520 supports communications with other systems or devices. For example, the communications unit 520 could include a network interface card or a wireless transceiver facilitating communications over the network. The communications unit 520 may support communications through any suitable physical or wireless communication link(s). The communications unit 520 could communicate with a wireless device for control of the non-electric powered, off-grid, power station 100.

The I/O unit 525 can include the start switch and various status indicators illustrated in FIGS. 1-3B. The status indicators can also include a plurality of LEDs that indicate specific operating statuses, such as heating, charging, standby, etc. The I/O unit 525 allows for input and output of data. For example, the I/O unit 525 may provide a connection for user input through a button, a touchscreen, or other suitable input device. The I/O unit 525 may also send output to LEDS, a display, or other suitable output device. A display could present programming and information to a user.

The sensor 540 can include any of the various sensors illustrated in FIGS. 1-3B. The sensors 540 can provide feedback of the flames on the burner, the temperature of the fluid, the fill level of the fluid, the angle of tilt of the power station 100, etc. to the user or stored in the storage device 515. Sensors 540 can include temperature sensors, pressure sensors, tilt sensors, etc.

The TEG can include the TEG 232 illustrated in FIG. 2 and TEGs 356 illustrated in FIG. 3B. The TEG 545 provides power to the different components of the electronic device, either directly or through bus 505. The TEG 545 can power an internal rechargeable battery or power storage 550 for start-up purposes. The TEG 545 can fully charge the electrical components of the device without any outside power source. The power storage 550 can be powered by the TEG 545 and distribute power to other components or the power can be directly supplied by the TEG 545 to the different components. The TEG 545 can supply power to external devices 560 through the output power plugs 555.

The output power plugs 555 can include the output power plugs 360 illustrated in FIG. 3B. The output power plugs 555 allow an external device 560 to connect to the power station 500 in order to be charged. The power output from the TEG 545 can be distributed to the external device 560 through one or more output power plugs 555.

Although FIG. 5 illustrates an example of an electronic power station 500, various changes may be made to FIG. 5. For example, various components in FIG. 5 could be combined, further subdivided, or omitted and additional components could be added according to particular needs. As a particular example, the processing device 510 could be divided into multiple processors, such as one or more central processing units (CPUs) and one or more graphics processing units (GPUs). In addition, as with computing and communication networks, electronic devices can come in a wide variety of configurations, and FIG. 5 does not limit this disclosure to any particular electronic device.

Although the present disclosure has been described with exemplary embodiments, various changes and modifications may be suggested to one skilled in the art. It is intended that the present disclosure encompass such changes and modifications as fall within the scope of the appended claims.

What is claimed is:

1. A power station used with a fuel container and an external device, the power station comprising:
   a fuel connection for the fuel container;
   a fuel regulator located after the fuel connection on a fuel supply path and configured to reduce a pressure of fuel from the fuel container;
   a fuel solenoid located on the fuel supply path after the fuel regulator and configured to control a flow of the fuel from the fuel container to the burner;
   a controller configured to control, using the fuel solenoid, the flow of the fuel based on an operating status;
   a burner configured to produce combustible heat across a surface;
   a reservoir configured to store a cooling fluid;
   an output power plug configured to electrically connect to the external device; and
   a thermoelectric generator structured with a supply side, a waste side and a power output and configured to convert heat energy into electrical energy,
   wherein the supply side is directed towards the surface of the burner and receives the heat energy from the combustible heat of the burner, the waste side contacts the reservoir and disperses heat energy into the cooling fluid, and the power output outputs the converted electrical energy through the output power plug to power the external device.

2. The power station of claim 1, wherein the thermoelectric generator is a sole power supply for the output power plug.

3. The power station of claim 1, further comprising:
   a cooling fluid pump configured to circulate the cooling fluid from the reservoir.

4. The power station of claim 1, further comprising:
   an evaporator including a fill material to remove heat from the cooling fluid as the cooling fluid circulates.

5. The power station of claim 1, further comprising:
   a fan configured to generate an air current to remove heat from the cooling fluid as the cooling fluid passes through an evaporator.

6. The power station of claim 1, wherein the power station operates at a sound level below 50 decibels at full power generation of the thermoelectric generator.

7. The power station of claim 1, further comprising:
   an inverter configured to convert the electrical energy generated by the thermoelectric generator into an AC output at the output power plug.

8. The power station of claim 1, further comprising:
   an electrical storage element configured to store the electrical energy generated by the thermoelectric generator,
   wherein the controller is configured to shut off the burner in response to detecting that a charge status of the electrical storage element is full.

9. The power station of claim 1, further comprising:
   an electrical storage element configured to store the electrical energy generated by the thermoelectric generator,
   wherein the controller is configured to:
      power the external device with the electrical energy stored in the electrical storage element, and
      activate the burner in response to detecting a charge level of the electrical storage element falling below a charging threshold.

10. A method for operating a power station used with a fuel container and an external device, the method comprising:

receiving fuel from the fuel container connected to a fuel connection of the power station;

reducing a pressure of the fuel from the fuel container using a fuel regulator located after the fuel connection on a fuel supply path;

controlling a flow of the fuel from the fuel container to a burner using a fuel solenoid located on the fuel supply path after the fuel regulator;

producing combustible heat across a surface of the burner of the power station;

storing a cooling fluid in a reservoir of the power station;

receiving heat energy from the combustible heat of the burner at a supply side of a thermoelectric generator of the power station;

converting the heat energy into electrical energy using the thermoelectric generator;

outputting the converted electrical energy to power the external device through an output power plug using the power output of the thermoelectric generator; and dispersing heat energy into the cooling fluid through a waste side of the thermoelectric generator.

11. The method of claim 10, wherein the thermoelectric generator is a sole power supply for the output power plug.

12. The method of claim 10, further comprising at least one of:
circulating the cooling fluid from the reservoir using a cooling fluid pump;
removing the heat from the cooling fluid as the cooling fluid circulates through a fill material of an evaporator; and
generating, using a fan of the power station, an air current to remove heat from the cooling fluid as the cooling fluid passes through an evaporator.

13. The power station of claim 10, further comprising at least one of:
operating at a sound level below 50 decibels at full power generation of the thermoelectric generator; and
converting, using an inverter, the electrical energy generated by the thermoelectric generator into an AC output at the output power plug.

14. The method of claim 10, further comprising:
storing, in an electrical storage element, the electrical energy generated by the thermoelectric generator, and
shutting off the burner in response to detecting that a charge status of the electrical storage element is full.

15. The method of claim 10, further comprising:
storing, in an electrical storage element, the electrical energy generated by the thermoelectric generator;
powering the external device with the electrical energy stored in the electrical storage element; and
activating the burner in response to detecting a charge level of the electrical storage element falling below a charging threshold.

16. A power station used with a fuel container and an external device, the power station comprising:
a burner configured to produce combustible heat across a surface;
a reservoir configured to store a cooling fluid;
an output power plug configured to electrically connect to the external device; and
a thermoelectric generator structured with a supply side, a waste side and a power output and configured to convert heat energy into electrical energy, wherein the supply side is directed towards the surface of the burner and receives the heat energy from the combustible heat of the burner, the waste side contacts the reservoir and disperses heat energy into the cooling fluid, and the power output outputs the converted electrical energy;

an electrical storage element configured to store the electrical energy generated by the thermoelectric generator; and a controller configured to:
power the external device through the output power plug with the electrical energy stored in the electrical storage element, and
activate the burner in response to detecting a charge level of the electrical storage element falling below a charging threshold.

17. The power station of claim 16, wherein the thermoelectric generator is a sole power supply for the output power plug; and/or wherein the power station operates at a sound level below 50 decibels at full power generation of the thermoelectric generator.

18. The power station of claim 16, further comprising at least one of:
a cooling fluid pump configured to circulate the cooling fluid from the reservoir;
an evaporator including a fill material to remove heat from the cooling fluid as the cooling fluid circulates;
a fan configured to generate an air current to remove heat from the cooling fluid as the cooling fluid passes through an evaporator; and
an inverter configured to convert the electrical energy generated by the thermoelectric generator into an AC output at the output power plug.

19. The power station of claim 16, wherein the controller is configured to shut off the burner in response to detecting that a charge status of the electrical storage element is full.

20. A method for operating a power station used with a fuel container and an external device, the method comprising:
producing combustible heat across a surface of a burner of the power station;
storing a cooling fluid in a reservoir of the power station;
receiving heat energy from the combustible heat of the burner at a supply side of a thermoelectric generator of the power station;
converting the heat energy into electrical energy using the thermoelectric generator;
dispersing heat energy into the cooling fluid through a waste side of the thermoelectric generator;
storing, in an electrical storage element, the electrical energy generated by the thermoelectric generator;
outputting the electrical energy to power the external device through an output power plug by powering, using a controller of the power station, the external device with the electrical energy stored in the electrical storage element; and
activating, using the controller of the power station, the burner in response to detecting a charge level of the electrical storage element falling below a charging threshold.

21. The method of claim 20, further comprising at least one of:
circulating the cooling fluid from the reservoir using a cooling fluid pump;
removing the heat from the cooling fluid as the cooling fluid circulates through a fill material of an evaporator;
generating, using a fan of the power station, an air current to remove heat from the cooling fluid as the cooling fluid passes through an evaporator;
operating at a sound level below 50 decibels at full power generation of the thermoelectric generator;

using the thermoelectric generator as a sole power supply for the output power plug; and converting, using an inverter, the electrical energy generated by the thermoelectric generator into an AC output at an output power plug.

22. The method of claim 20, further comprising shutting off the burner in response to detecting that a charge status of the electrical storage element is full.

* * * * *